(12) United States Patent
Heath et al.

(10) Patent No.: US 11,557,981 B2
(45) Date of Patent: *Jan. 17, 2023

(54) SELF-BIASING IDEAL DIODE CIRCUIT

(71) Applicant: Analog Devices International Unlimited Company, Limerick (IE)

(72) Inventors: Jeffrey Lynn Heath, Santa Barabara, CA (US); Trevor W. Barcelo, Andover, MA (US)

(73) Assignee: Analog Devices International Unlimited Company, Limerick (IE)

( * ) Notice: Subject to any disclaimer, the term of this patent is extended or adjusted under 35 U.S.C. 154(b) by 191 days.

This patent is subject to a terminal disclaimer.

(21) Appl. No.: 17/087,000

(22) Filed: Nov. 2, 2020

(65) Prior Publication Data

US 2021/0111640 A1 Apr. 15, 2021

Related U.S. Application Data

(63) Continuation of application No. PCT/US2019/028946, filed on Apr. 24, 2019, which
(Continued)

(51) Int. Cl.
*H02M 7/219* (2006.01)
*H02M 7/25* (2006.01)
(Continued)

(52) U.S. Cl.
CPC ............. *H02M 7/219* (2013.01); *H02M 1/08* (2013.01); *H02M 7/217* (2013.01); *H02M 7/25* (2013.01);
(Continued)

(58) Field of Classification Search
CPC ..... H02M 3/33592; H02M 2001/0006; H02M 7/217; H02M 7/19; H02M 7/25;
(Continued)

(56) References Cited

U.S. PATENT DOCUMENTS 4,519,024 A * 5/1985 Federico ................ G01R 19/02
 363/127
6,271,712 B1 8/2001 Ball
 (Continued)

FOREIGN PATENT DOCUMENTS

CN 112075024 12/2020
JP 2015111969 6/2015
(Continued)

OTHER PUBLICATIONS

U.S. Appl. No. 15/970,406, U.S. Pat. No. 10,333,425, filed May 3, 2018, Self-Biasing Ideal Diode Circuit.
(Continued)

*Primary Examiner* — Harry R Behm
(74) *Attorney, Agent, or Firm* — Schwegman Lundberg & Woessner, P.A.

(57) ABSTRACT

An ideal diode circuit is described which uses an NMOS transistor as a low-loss ideal diode. The control circuit for the transistor is referenced to the anode voltage and not to ground, so the control circuitry may be low voltage circuitry, even if the input voltage is very high, referenced to earth ground. A capacitor is clamped to about 10-20 V, referenced to the anode voltage. The clamped voltage powers a differential amplifier for the detecting if the anode voltage is greater than the cathode voltage. The capacitor is charged to the clamped voltage during normal operation of the ideal diode by controlling the conductivity of a second transistor coupled between the cathode and the capacitor, enabling the circuit to be used with a wide range of frequencies and voltages. All voltages applied to the differential amplifier are equal to or less than the clamped voltage.

16 Claims, 5 Drawing Sheets

Related U.S. Application Data is a continuation of application No. 15/970,406, filed on May 3, 2018, now Pat. No. 10,333,425.

(51) Int. Cl.

| | | |
|---|---|---|
| *H02M 1/08* | (2006.01) | |
| *H03K 17/042* | (2006.01) | |
| *H02M 7/217* | (2006.01) | |
| *H03K 17/30* | (2006.01) | |
| *H02M 3/335* | (2006.01) | |
| *H02M 1/00* | (2006.01) | |

(52) U.S. Cl.
CPC ..... *H03K 17/04206* (2013.01); *H03K 17/302* (2013.01); *H02M 1/0006* (2021.05); *H02M 3/33592* (2013.01)

(58) Field of Classification Search
CPC ............ Y02B 70/1475; Y02B 70/1456; H03K 17/04206; H03K 17/302
See application file for complete search history.

(56) References Cited

U.S. PATENT DOCUMENTS

| | | | |
|---|---|---|---|
| 7,920,013 | B2 | 4/2011 | Sachdev et al. |
| 8,022,679 | B2 | 9/2011 | Sachdev et al. |
| 8,804,389 | B2 | 8/2014 | Heath et al. |
| 10,333,425 | B1 | 6/2019 | Heath et al. |
| 2002/0141214 | A1 | 10/2002 | Grover |
| 2009/0261798 | A1 | 10/2009 | Sachdev et al. |
| 2011/0096578 | A1* | 4/2011 | Fang ........................ H03K 5/08 363/127 |
| 2014/0268915 | A1 | 9/2014 | Kong et al. |
| 2016/0276952 | A1 | 9/2016 | Mehringer et al. |
| 2016/0037301 | A1 | 12/2016 | Yoshinaga |
| 2017/0110959 | A1* | 4/2017 | Ishimaru ................ H03K 17/30 |
| 2018/0191152 | A1 | 7/2018 | Ishimaru et al. |

FOREIGN PATENT DOCUMENTS

| | | |
|---|---|---|
| JP | 2015116077 | 6/2015 |
| JP | 2016073141 | 5/2016 |
| JP | 2017079527 | 4/2017 |
| JP | 6137723 | 5/2017 |
| JP | 7066876 B2 | 5/2022 |
| WO | WO-2019212828 A1 | 11/2019 |

OTHER PUBLICATIONS

"U.S. Appl. No. 15/970,406, Non Final Office Action dated Nov. 13, 2018", 10 pgs.

"U.S. Appl. No. 15/970,406, Notice of Allowance dated Feb. 28, 2019", 9 pgs.

"U.S. Appl. No. 15/970,406, Response filed Jan. 24, 2019 to Non Final Office Action dated Nov. 13, 2018", 9 pgs.

"International Application Serial No. PCT/US2019/028946, International Search Report dated Aug. 14, 2019", 3 pgs.

"International Application Serial No. PCT/US2019/028946, Written Opinion dated Aug. 14, 2019", 5 pgs.

"European Application Serial No. 19729890.4, Response to Communication Pursuant to Rules 161 and 162 filed Jun. 7, 2021", 16 pgs.

"Japanese Application Serial No. 2020-561728, Notification of Reasons for Refusal dated Dec. 13, 2021", w/ English Translation, 4 pgs.

"Japanese Application Serial No. 2020-561728, Response filed Mar. 8, 2022 to Office Action dated Dec. 13, 2021", w/ English Translation, 9 pgs.

"International Application Serial No. PCT/US2019/028946, International Preliminary Report on Patentability dated Nov. 12, 2020", 7 pgs.

* cited by examiner

SELF-BIASING IDEAL DIODE CIRCUIT

FIELD OF THE DISCLOSURE

This invention relates to ideal diode circuits where a low-loss switch is automatically controlled to rectify an AC voltage and, more particularly, to an ideal diode control circuit that uses a low operating voltage independent of the voltage rectified by the ideal diode.

BACKGROUND

Although the ideal diode of the present invention may be used in any application requiring a diode, the invention is particularly beneficial in circuits that rectify relatively high voltages and currents, such as in a power application for rectifying an AC voltage.

FIG. 1 illustrates a simple application of a diode 10, whether it is a typical pn junction diode or an ideal diode. An AC source 12 is assumed to apply a 1 kHz sinusoidal voltage, having peaks of +100 V and −100 V, to the anode of the diode 10. The AC voltage is rectified by the diode 10 and somewhat smoothed by a capacitor 16 for application of the resulting voltage to a load 18. The load 18 draws current from the diode 10 when the diode is conducting and draws current from the capacitor 16 when the diode 10 is reverse biased. Therefore, there is some voltage droop when the diode 10 is reverse biased.

FIG. 2 illustrates a single cycle of operation of the circuit of FIG. 1. Both the sinusoidal anode voltage 20 and the smoothed voltage 22 applied to the load 18 are shown. During steady state operation, the capacitor 16 charges to the peak +100 V when the diode 10 is forward biased, and the voltage droops to about +40 V when the diode 10 is reverse biased. The droop amount depends on the capacitor 16 and the load 18. Therefore, the diode 10 becomes forward biased (i.e., conducting) when the input AC voltage exceeds +40 V and becomes reversed biased (i.e., off) after the AC voltage reaches its peak of +100 V.

Many applications require the conversion of AC power to DC power, such as shown in FIG. 1. This can be done in many ways, but the most basic implementations use one or more rectifying diodes, such as in a full-wave bridge circuit. Independent of the AC frequency or topology (half-wave, full-wave, single-phase, or multi-phase), a diode-based rectifier will always include a voltage drop equal to the forward voltage of the diodes at the operating load current. Associated with this voltage drop is a power dissipation equal to the voltage drop multiplied by the diode current.

An ideal diode circuit automatically switches a low-loss switch, such as a MOSFET, when it is detected that the anode terminal is at a voltage higher than the cathode terminal. Comparators and other circuitry are used in the control circuit. The control circuit may be powered by the voltage applied to the ideal diode. Typically, the control circuit is referenced to ground, so the components in the control circuit must be able to operate with the full anode-to-ground voltage. When the voltage to be rectified is a relatively high voltage (e.g., 120 VAC), the control circuitry needs to be fabricated using special techniques to handle the high voltage without breakdown. This increases the size and cost of the control circuitry.

NMOS transistors are frequently used as the low-loss switch since their conductivity is typically better than that of PMOS transistors. Since the source of the NMOS transistor is coupled to the anode terminal, the control circuitry requires a voltage-boosting charge pump, referenced to earth ground, to generate a gate voltage higher than the anode voltage. The charge pump generally runs continuously to maintain the boosted voltage needed to drive the NMOS transistor. This continuous running of the charge pump consumes power. This boosted voltage also requires the control circuitry to handle a voltage higher than the anode voltage without breakdown.

It is also known to eliminate the earth ground reference from the boost circuit, but the boost circuit can only run when the ideal diode is off. Therefore, the ideal diode must be periodically forced off to generate the boost voltage.

What is needed is an ideal diode circuit that uses low-voltage control circuitry (e.g., up to 20 V), even when the voltage to be rectified may be a high voltage (e.g., greater than 120 VAC). What is also needed is an ideal diode circuit that can generate a boosted voltage for controlling an NMOS transistor without interfering with the normal ideal diode operation. Such an ideal diode circuit can then be operated accurately in AC applications and with high voltages to be rectified.

SUMMARY

An ideal diode circuit is described which uses a low-loss switch (e.g., a MOSFET) that presents only a nominal voltage drop when conducting, resulting in very low power dissipation.

The control circuit for the low-loss switch is not referenced to earth ground, so may be low voltage circuitry, even if the input anode voltage is very high (e.g., 240 VAC). This greatly reduces the size and cost of the circuit for high power/voltage applications. The control circuitry can be formed in an integrated circuit using a dense, low-cost, low voltage process. The low-loss switch may be externally supplied by the user or provided on the same chip as the control circuitry.

A novel boost circuit, for generating a gate voltage higher than the anode voltage, is also part of the low voltage control circuitry. The boost circuit is not a continuous switching type so consumes very little quiescent power. The boost circuit operates properly with any AC anode voltage and frequency.

Since the design eliminates both the earth ground reference and the traditional charge pump boost circuitry, the same topology can be used for both low-side and high-side rectification.

Various embodiments are described.

DETAILED DESCRIPTION

Figure 1:
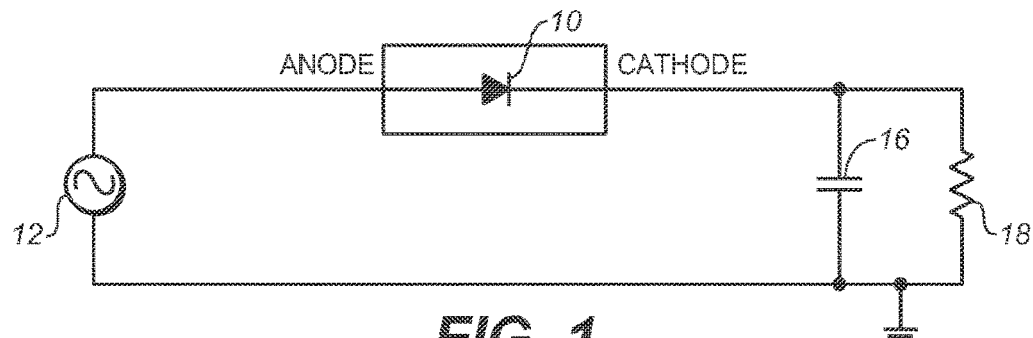
FIG. 1 illustrates a possible use of a diode (whether a pn junction diode or an ideal diode) for rectifying a sinusoidal AC input voltage, where the rectified voltage is smoothed by a capacitor and applied to a load.
Figure 3:
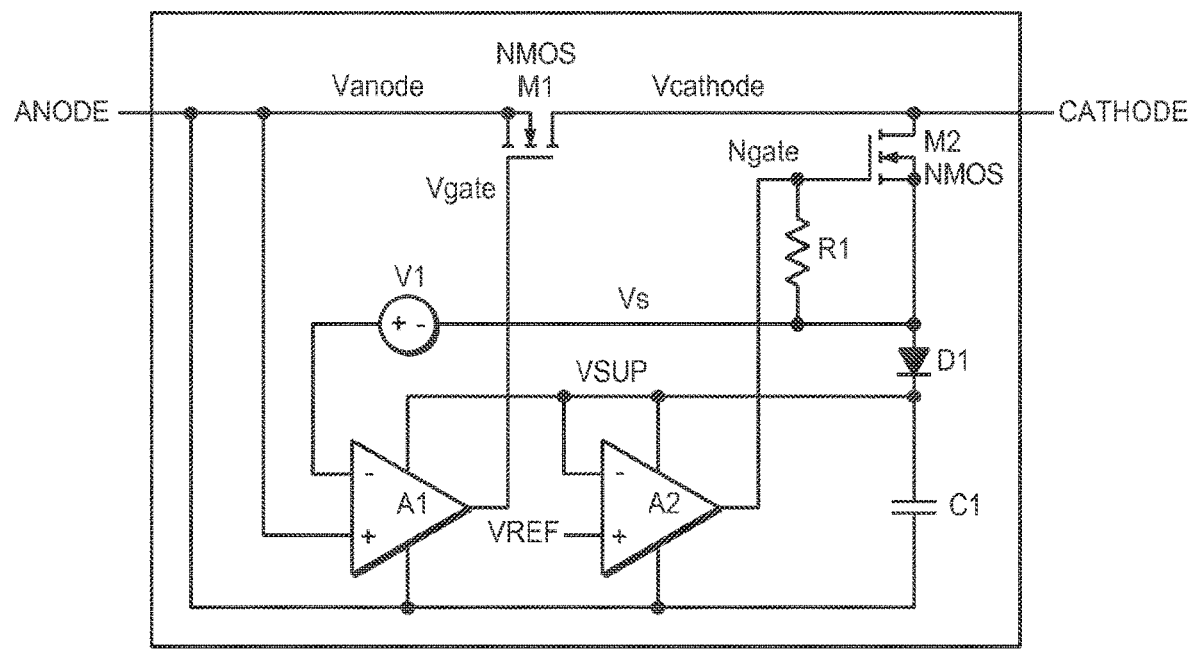
FIG. 3 shows one example of an ideal diode circuit in accordance with the present invention, where the low-loss switch is selected to handle the high voltage and high power for a particular application, but the control circuitry is low voltage circuitry for use with any type of input voltage.

FIG. 3 illustrates one embodiment of the invention. The ideal diode may substitute for the diode 10 in FIG. 1 or in any AC circuit where a diode is used.

An enhancement-mode NMOS transistor M1 is the low-loss rectifying transistor acting as an ideal diode. It is driven by the differential amplifier A1. The output voltage (Vgate) of the amplifier A1 is driven high when the anode voltage (Vanode) exceeds the cathode voltage (Vcathode).

An offset voltage V1 can be used to set a forward voltage of the ideal diode. This offset voltage V1 will be typically 5 to 50 mV, but can be adjusted according to the application requirements. The offset voltage V1 is ignored in the below explanation of operation for simplicity, but its importance is well understood by those skilled in the art of ideal diodes.

The NMOS transistor M1 is used in this example due to its conductivity advantage over a PMOS transistor. The circuit may be easily modified to drive a PMOS transistor, such as by using an inverter to drive the gate.

The NMOS transistor M1 must be rated to handle the maximum reverse voltage across it. The user may supply the NMOS transistor M1 as an external component if high voltage and high power capability is needed. For lower voltage or power applications, the NMOS transistor M1 may be on the same chip as the control circuitry.

A second NMOS transistor M2 is a depletion mode device, so it conducts with zero gate-source voltage (Vgs) and is turned off by a negative Vgs. The NMOS transistor M2 operation blocks a high cathode voltage from the rest of the control circuitry so allows the rest of the control circuitry to be low voltage. The voltage rating of the NMOS transistor M2 should be the same as the rating of the NMOS transistor M1.

The bodies of the transistors M1 and M2 are tied to their sources, as depicted by the component symbols. Alternate body configurations may be used.

At start-up, when the capacitor C1 is uncharged and the anode voltage is more positive then the cathode voltage, the ideal diode will be forward biased and the body diode of the NMOS transistor M1 conducts. As a result, the cathode voltage will be at or slightly below the anode voltage. Any load capacitance coupled to the cathode will then be charged to approximately the anode voltage.

When the AC anode voltage goes below the cathode voltage, the NMOS transistor M1 stops conducting, and the depletion mode NMOS transistor M2 conducts to charge the capacitor C1 to a certain voltage level via the diode D1, described in greater detail later. The voltage across the capacitor C1 is coupled to the power terminals of the differential amplifiers A1 and A2. The anode voltage (Vanode) is used as the reference voltage when powering the amplifiers A1 and A2. The top terminal of the capacitor C1 is more positive than the anode voltage and this voltage is termed the supply voltage Vsup. Vsup is set by a reference voltage, described later, so Vsup is a clamped voltage. Therefore, the amplifiers A1 and A2 are powered by the voltage Vsup-Vanode, which is set to be a low voltage. The amplifier A, effectively acting as a comparator, will output either Vsup or Vanode, depending on the whether the ideal diode is forward biased or reverse biased. There is no earth ground reference terminal used in the ideal diode circuit, so the operating voltage of the control circuitry is independent of the absolute value of the anode voltage. The NMOS transistor M2 blocks cathode voltages greater than Vanode+Vsup from the rest of the control circuitry (which is referenced to the anode voltage), allowing the control circuitry to use low voltage components.

The diode D1 isolates the capacitor C to prevent discharging when the cathode voltage falls below Vanode+Vsup.

The gate-source resistor R1 causes the default Vgs of the NMOS transistor M2 to be 0 volts, so the NMOS transistor is on before the capacitor C1 is charged. In this way, when the cathode voltage is held high by the load capacitance while the ideal diode is reverse biased, the NMOS transistor M2 and diode D1 immediately charge the capacitor C1 to Vsup.

Figure 2:
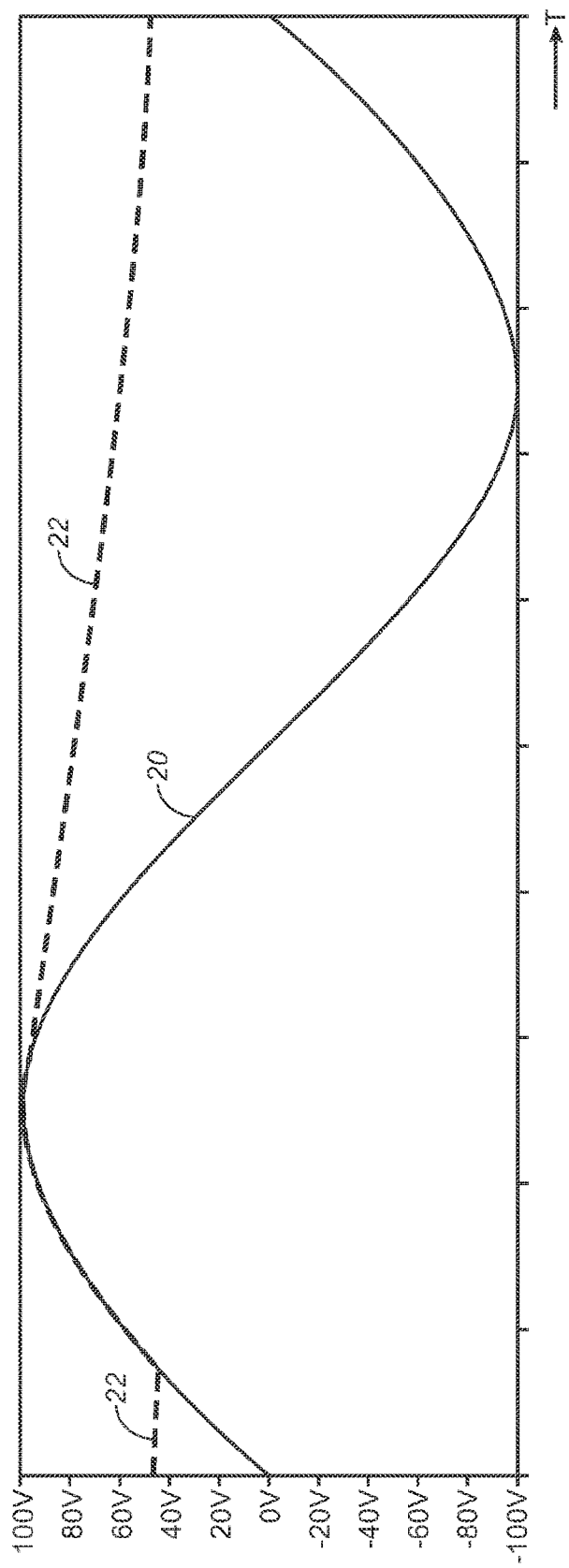
FIG. 2 illustrates a single cycle of the sinusoidal anode voltage applied to the diode of FIG. 1, having peaks of +100 V and −100 V. and also illustrates the "smoothed" cathode voltage.

Assuming the anode voltage (the reference voltage) is a sinusoidal voltage going between +100 V and −100 V, the control circuitry clamps the voltage across the capacitor C1 to about 10–20 V since the gate of the NMOS transistor M1 may need a gate-source voltage (Vgs) of 10-20 V to fully turn on with a minimum of power dissipation. The cathode voltage may be similar to the difference between the waveforms 20 and 22 in FIG. 2, assuming a similar load and load capacitance.

A reference voltage Vref is generated on the chip using well-known circuitry, and the reference voltage Vref sets the maximum voltage across the capacitor C1. In one example, the reference voltage Vref is 20 V above the anode voltage, but may be any suitable level above the anode voltage. 20 V is considered a low voltage, allowing the control circuitry to use low-voltage fabrication techniques. The voltage source that generates Vref may use the anode voltage to generate a relatively fixed 20 V, such as with a linear voltage regulator and a storage capacitor, and this 20 V is added to the instantaneous anode voltage to create Vref. There is an insubstantial current drawn from the Vref generator.

The output of the amplifier A2 is coupled to the gate of the NMOS transistor M2. The feedback loop for the amplifier A2 causes the output voltage of the amplifier A2 to control the NMOS transistor M2 so that the supply voltage Vsup equals the reference voltage Vref applied to the inputs of the amplifier A2. In other words, once the capacitor C1 voltage goes above the reference voltage Vref, the "negative" output of the amplifier A2 causes the depletion mode NMOS transistor M2 to turn off. The control of the NMOS transistor M2 is continuous so there is no need for a switching boost converter to generate a boosted voltage for controlling the NMOS transistor M1. This improves efficiency.

Very little quiescent current is used by amplifiers A1 and A2 since little or no quiescent current is consumed by the gates of the transistors M1 and M2, and the inputs into the amplifiers A1 and A2 are high impedance. Therefore, the capacitor C1 stays adequately charged when the cathode voltage is below the reference voltage Vref for an extended time. Some Vsup droop should not affect the performance of the circuit. Even if there is a very long delay in the cathode voltage going above the reference voltage Vref and the capacitor C1 becomes discharged, the capacitor C1 will be quickly charged (like at start-up) once the cathode voltage exceeds the reference voltage while the ideal diode is reverse biased.

The output of the amplifier A1 is termed Vgate. During steady state operation, when the cathode voltage is lower than the anode voltage by at least the offset voltage V1, the differential inputs into amplifier A1 cause Vgate to equal Vsup. Since Vsup is about 20 V higher than the source voltage of the NMOS transistor M1, the NMOS transistor M1 is fully turned on. Now the cathode voltage is approximately equal to the anode voltage, neglecting the offset voltage V1.

When the cathode voltage becomes within the offset voltage V1 of the anode voltage, or greater than the anode voltage, the output (Vgate) of the amplifier A1 is the anode voltage to turn off the NMOS transistor M1.

When Vsup is approximately equal to Vref (while Vcathode is above Vanode), the NMOS transistor M2 is off, by action of the amplifier A2, and the capacitor C1 has been charged to Vref. The NMOS transistor M1 is also obviously off since the cathode voltage is greater than the anode voltage. When the cathode voltage eventually goes below Vref (i.e., approaches the anode voltage), the body diode of the NMOS transistor M2 will cause its source voltage Vs to fall and follow the cathode voltage. At this point, it is important for the amplifier A2 to turn on the NMOS transistor M2 so that Vs is equal to the cathode voltage. This will allow proper sensing of the cathode voltage as it goes below the anode voltage, so that the amplifier A1 will turn on the NMOS transistor M1 as soon as the source voltage Vs (and therefore the cathode voltage) falls below the anode voltage. The offset voltage V1 has been ignored in this discussion for simplicity.

As seen, with the exception of the NMOS transistor M2, the control circuitry is only subjected to low voltages up to the reference voltage Vref (e.g., 20 V), referenced to the anode voltage. Therefore, the control circuitry may be low voltage. More specifically, when the cathode voltage becomes much greater than the anode voltage, while the NMOS transistor M1 is off, then the source voltage Vs of the NMOS transistor M2 will be clamped to approximately Vref, due to the feedback action of the amplifier A2, to allow all of the transistors in the circuit to be low voltage with the exception of the NMOS transistors M1 and M2.

The design of the control circuitry is independent of whether the ideal diode is for rectifying high voltages, so the control circuitry chip can be used in any application. Only the parameters of the transistors M1 and M2 are an issue for high voltage applications.

Many other types of transistors may be used instead of NMOS transistors M1 and M2. For example, IGBTs, GaN, SiC, PMOS, and other types of transistors may be used. The transistors are considered to act as switches since they are generally controlled to be on or off, even though there may be some intermediate conductivity when the control signal is approximately at the threshold voltage.

Figure 4:
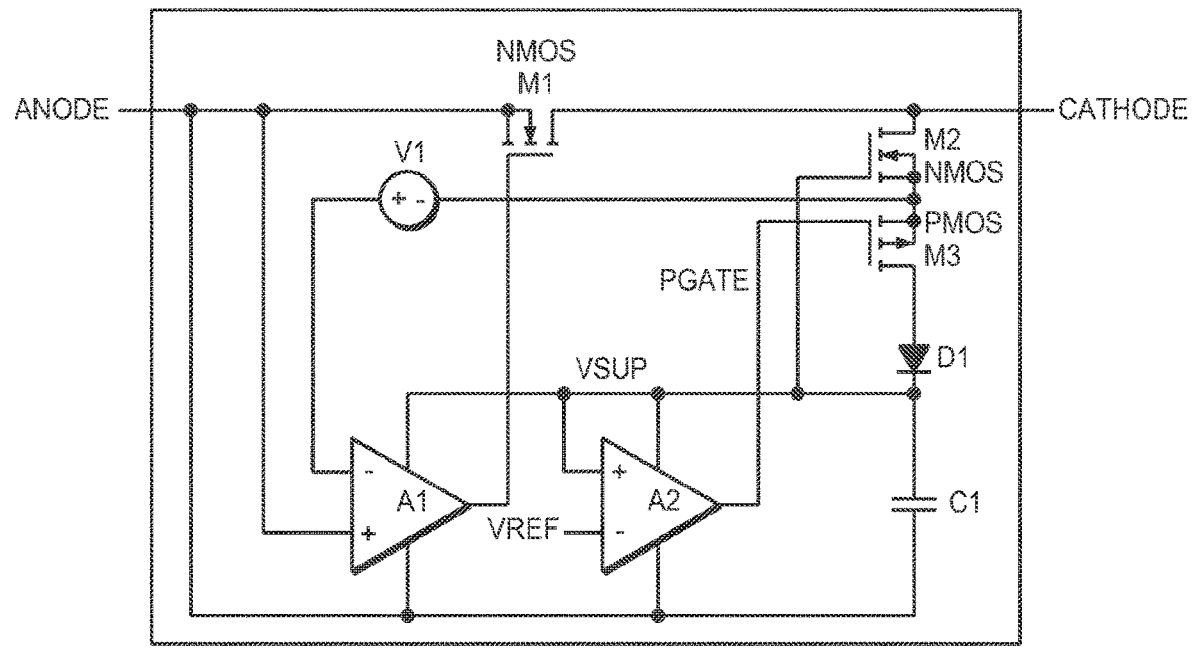
FIGS. 4-8 are variations of the ideal diode circuit of FIG. 3 using the same basic principles of operation.

FIG. 4 is similar to FIG. 3 but the amplifier A2 controls a PMOS transistor M3 to clamp the capacitor C1 voltage (supply voltage Vsup) to the reference voltage Vref. The gate of the NMOS transistor M2 is driven by Vsup. When the cathode voltage is much higher than the anode voltage, control of the PMOS transistor M3 causes the control circuitry to not be subjected to the high cathode voltage. When the cathode voltage is close to the anode voltage, the NMOS transistor M2 turns on so the cathode and anode voltages are applied to the inputs of the amplifier A1.

Figure 5:
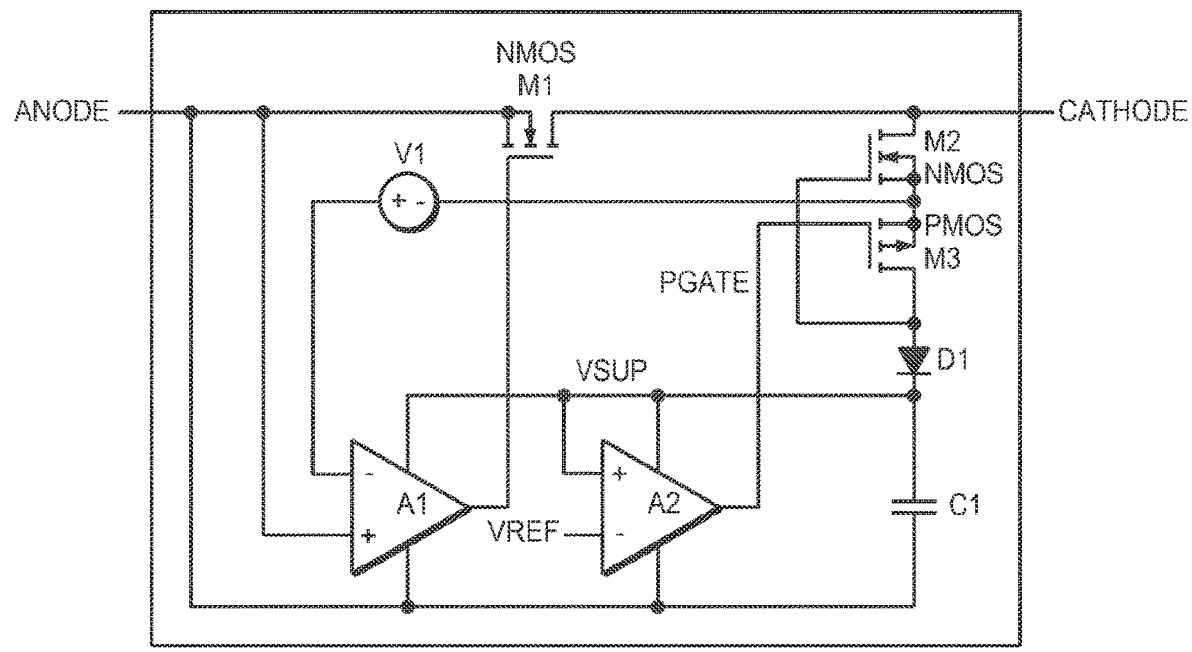

FIG. 5 is similar to FIG. 4 but the gate of the NMOS transistor M2 is tied to the anode of the diode D1 so that the gate voltage is Vsup plus the forward voltage of the diode D1.

Figure 6:
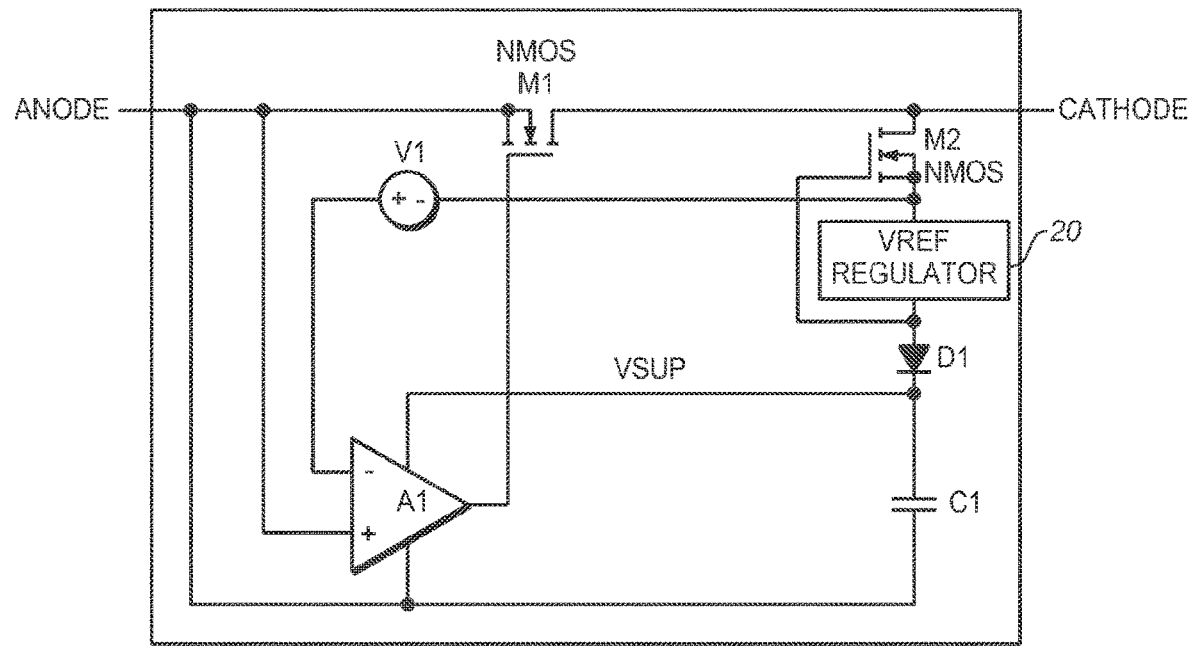

FIG. 6 deletes amplifier A2 and inserts a Vref regulator 20 between the source of the NMOS transistor M2 and the diode D1. The Vref regulator 20 subtracts a voltage from the cathode voltage so that the voltage at the diode D1 is Vref. Vref is a voltage referenced to the anode voltage (not ground) so that the amplifier A1 is only subjected to approximately the Vref voltage. The gate of the NMOS transistor M2 is tied to the anode of the diode D1. As in other embodiments, the control circuit voltages are limited to low voltages even when the cathode voltage is much higher than the anode voltage.

Figure 7:
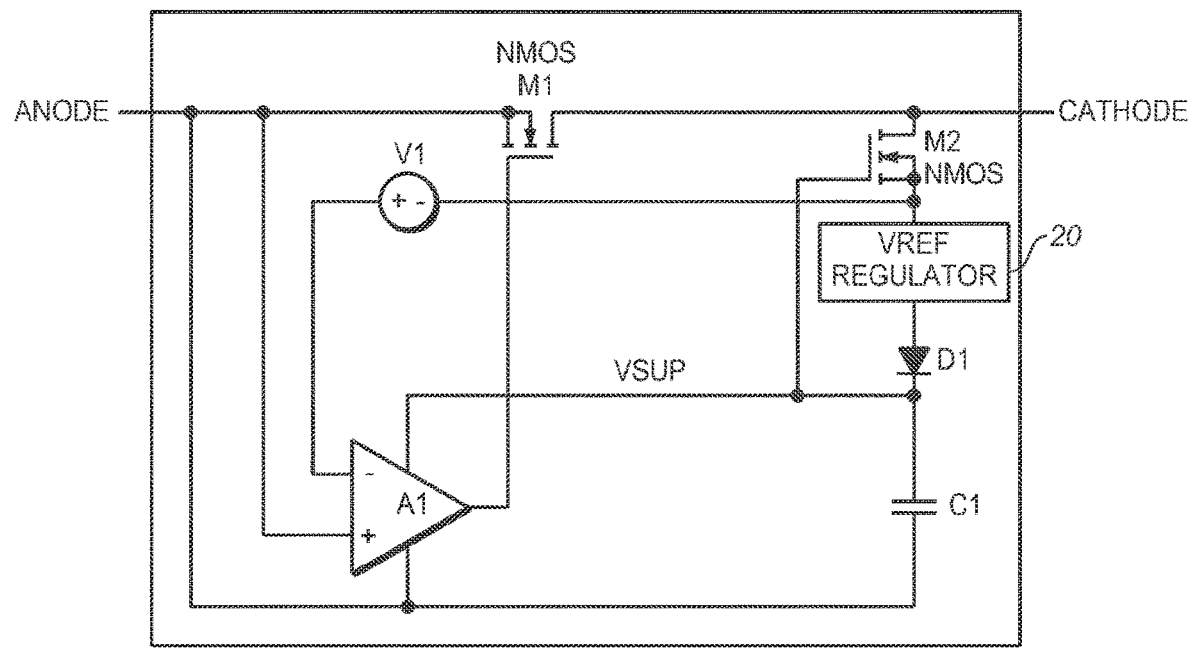

FIG. 7 is similar to FIG. 6 except that the gate of the NMOS transistor M2 is tied to Vsup.

Figure 8:
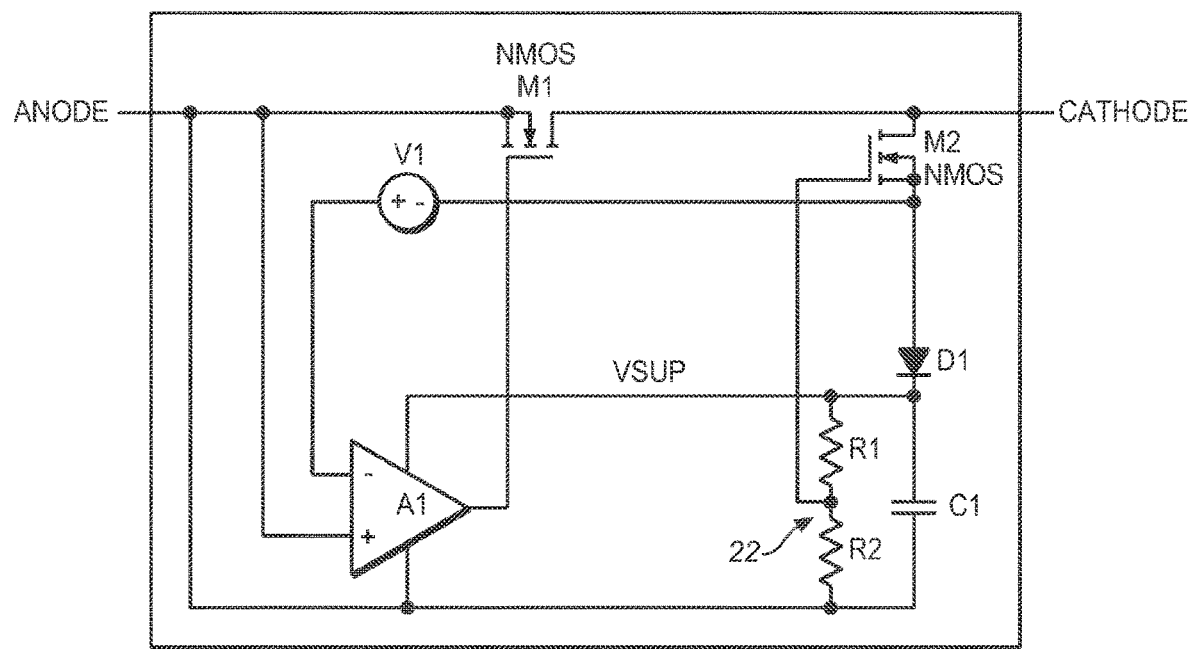

FIG. 8 is similar to FIG. 7 except that the Vref regulator 20 is deleted and the gate of the NMOS transistor M2 is connected to a voltage divider 22, formed of resistors R1 and R2, coupled between the anode voltage and Vsup to generate the reference voltage Vref. The NMOS transistor M2 will turn off when the cathode voltage exceeds the anode voltage by the amount of the divided voltage (referenced to the anode voltage). Therefore, the control circuitry may be low voltage circuitry.

The ideal diode circuits shown herein are used for AC anode voltages, but the circuits may be easily adapted for DC anode voltages.

All the control circuits shown may be formed as integrated circuits, and the transistors M1 and M2 may on the chip or external to the chip. Multiple transistors may be connected in parallel for added current capability but are considered as a single transistor for purposes of this disclosure. If the capacitor C1 needs to be relatively large, it may be provided as an external component.

Many other circuit configurations may be used to carry out the inventive techniques.

As used herein, the term "coupled to" includes a direct connection as well as a connection through one or more other components.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. An ideal diode circuit comprising:
    a first transistor, coupled between an anode terminal and a cathode terminal of the ideal diode circuit, and including a control terminal;
    a second transistor having a first terminal coupled to the cathode terminal, a second terminal, and a control terminal coupled to a circuit feedback loop to cause a voltage across the capacitor to equal a clamped voltage;
    a capacitor arranged between the anode terminal and the second terminal of the second transistor; and
    a first differential amplifier having differential input terminals and an output terminal, the differential input terminals coupled to the anode terminal and to the second terminal of the second transistor such that the second transistor is arranged between the cathode terminal and one of the differential input terminals, and the output terminal coupled to the control terminal of the first transistor to control the first transistor to be on when an anode voltage at the anode terminal is greater than a cathode voltage at the cathode terminal, and off when the anode voltage is less than the cathode voltage, wherein the first differential amplifier further includes power terminals coupled across the capacitor and referenced to the anode voltage at the anode terminal.

2. The ideal diode circuit of claim 1, including:
    a diode having an anode coupled to the second terminal of the second transistor and a cathode coupled to the capacitor;

a second differential amplifier that includes a first differential input terminal coupled to the capacitor, a second differential input terminal coupled to a reference voltage, an output terminal coupled to a control terminal of the second transistor, and power terminals, and the power terminals of the first differential amplifier and the second differential amplifier are coupled across the capacitor.

3. The ideal diode circuit of claim 2, including:
an offset voltage circuit arranged between the second terminal of the second transistor and one of the differential input terminals of the first differential amplifier; and
a resistive circuit element coupled between the control terminal and the second terminal of the second transistor.

4. The ideal diode circuit of claim 1, including
a third transistor including a first terminal, a second terminal, and a control terminal, wherein, the first terminal of the third transistor is coupled to the second terminal of the second transistor;
a diode having an anode coupled to the second terminal of the third transistor and a cathode coupled to the capacitor and a control terminal of the second transistor; and
a second differential amplifier that includes a first differential input terminal coupled to the cathode of the diode, a second differential input terminal coupled to a reference voltage, and an output terminal coupled to the control terminal of the third transistor.

5. The ideal diode circuit of claim 1, including:
a third transistor including a first terminal, a second terminal, and a control terminal, wherein, the first terminal of the third transistor is coupled to the second terminal of the second transistor;
a diode including:
an anode coupled to the second terminal of the third transistor and a control terminal of the second transistor; and
a cathode coupled to the capacitor and a control terminal of the second transistor; and
a second differential amplifier that includes a first differential input terminal coupled to the cathode of the diode, a second differential input terminal coupled to a reference voltage, and an output terminal coupled to the control terminal of the third transistor.

6. The ideal diode circuit of claim 1, including:
a diode having a cathode coupled to the capacitor and an anode coupled to a control terminal of the second transistor;
a voltage regulator circuit coupled to the second terminal of the second transistor and configured to provide a reference voltage to the anode of the diode; and
wherein the first differential amplifier further includes a first power terminal coupled to the cathode of the diode and a second power terminal coupled to the anode terminal of the ideal diode circuit.

7. The ideal diode circuit of claim 1, including:
a diode having a cathode coupled to the capacitor and to a control terminal of the second transistor;
a voltage regulator circuit coupled to the second terminal of the second transistor and configured to provide a reference voltage to the anode of the diode; and
wherein the first differential amplifier further includes a first power terminal coupled to the cathode of the diode and a second power terminal coupled to the anode terminal of the ideal diode circuit.

8. The ideal diode circuit of claim 1, including:
a diode having a cathode coupled to the capacitor and an anode coupled to the second terminal of the second transistor;
an offset voltage circuit arranged between the second terminal of the second transistor and one of the differential input terminals of the first differential amplifier; and
a voltage divider circuit coupled across the capacitor wherein an output of the voltage divider circuit is coupled to a control terminal of the second transistor.

9. The ideal diode circuit of claim 1, wherein the first transistor is an n-type metal oxide semiconductor (NMOS) transistor and the second transistor is a depletion mode NMOS transistor.

10. The ideal diode circuit of claim 1, wherein the first transistor is a p-type metal oxide semiconductor (PMOS) transistor.

11. A method of operating a first transistor as an ideal diode circuit having an anode terminal and a cathode terminal, the method comprising:
setting an output of a first differential amplifier to a first state that activates a control terminal of the first transistor when an anode voltage at the anode terminal is greater than a cathode voltage at the cathode terminal;
setting an output of the first differential amplifier to a second state that deactivates the control terminal of the first transistor when the anode voltage at the anode terminal is less than the cathode voltage at the cathode terminal;
blocking the cathode voltage at the cathode terminal from the first differential amplifier using a second transistor, wherein differential input terminals of the first differential amplifier are coupled to the anode terminal and to the second transistor such that the second transistor is arranged between the cathode terminal and one of the differential input terminals; and
referencing the first differential amplifier to the anode voltage at the anode terminal and not to a circuit ground voltage;
charging a capacitor when the anode voltage at the anode terminal is less than the cathode voltage at the cathode terminal;
referencing the capacitor to the anode voltage at the anode terminals; and
powering the first differential amplifier using the voltage of the capacitor;
clamping a voltage at a first terminal of the capacitor to a clamped voltage;
wherein the referencing the capacitor to the anode voltage includes coupling a second terminal of the capacitor to the anode terminal; and
wherein the powering the first differential amplifier includes powering the first differential amplifier using a voltage that is a difference between the clamped voltage and the anode voltage.

12. The method of claim 11, including:
clamping a voltage at a first terminal of the capacitor to a clamped voltage using a circuit feedback loop; and
preventing discharging of the capacitor using a diode when the cathode voltage is less than the voltage of the anode plus the clamped voltage.

13. The method of claim 12, wherein the clamping the voltage at the first terminal of the capacitor to the clamped voltage includes setting the clamped voltage to a reference voltage using a second differential amplifier and powering the second differential amplifier using the voltage of the capacitor.

14. The method of claim 11, including applying an offset voltage to one of the differential input terminals of the first differential amplifier to provide a forward voltage of the ideal diode circuit.

15. The method of claim 11, wherein the blocking the cathode voltage includes blocking the cathode voltage at the cathode terminal from the first differential amplifier using a depletion mode transistor.

16. An electronic circuit comprising:
a voltage input to receive an alternating current (AC) voltage; and
a rectifying circuit having an anode terminal and a cathode terminal, the rectifying circuit including:
a first transistor, coupled between the anode terminal and the cathode terminal, and including a control terminal;
a second transistor having a first terminal coupled to the cathode terminal and a second terminal;
a capacitor arranged between the anode terminal and the second terminal of the second transistor;
a first differential amplifier having differential input terminals and an output terminal, the differential input terminals coupled to the anode terminal and to the second terminal of the second transistor such that the second transistor is arranged between the cathode terminal and one of the differential input terminals, and the output terminal coupled to the control terminal of the first transistor to control the first transistor to be on when an anode voltage at the anode terminal is greater than a cathode voltage at the cathode terminal, and off when the anode voltage is less than the cathode voltage;
a diode having an anode coupled to the second terminal of the second transistor and a cathode coupled to the capacitor;
a second differential amplifier that includes a first differential input terminal coupled to the capacitor, a second differential input terminal coupled to a reference voltage, an output terminal coupled to a control terminal of the second transistor, and power terminals; and
wherein the first differential amplifier further includes power terminals, and the power terminals of the first differential amplifier and the second differential amplifier are coupled across the capacitor.

\* \* \* \* \*